United States Patent [19]

Albarino

[11] Patent Number: 4,730,694

[45] Date of Patent: Mar. 15, 1988

[54] ELECTRO-MECHANICAL REPRODUCTION OF SOUND

[76] Inventor: Lawrence S. Albarino, 450 Ardsley Rd., Scarsdale, N.Y. 10583

[21] Appl. No.: 707,212

[22] Filed: Mar. 1, 1985

[51] Int. Cl.[4] .............................................. H05K 5/00

[52] U.S. Cl. .................................. 181/153; 181/144; 181/147; 181/156; 181/199

[58] Field of Search ............................... 181/144–147, 181/153, 199, 156; D14/30, 33, 34, 38

[56] References Cited

U.S. PATENT DOCUMENTS

| | | | |
|---|---|---|---|
| D. 251,973 | 5/1979 | Klopfer et al. | D14/34 X |
| D. 262,793 | 1/1982 | Hathaway et al. | D14/34 X |
| 4,006,308 | 2/1977 | Ponsgen | 181/153 X |
| 4,033,430 | 7/1977 | Bolden | 181/144 |
| 4,142,604 | 3/1979 | Smith | 181/199 X |
| 4,176,730 | 12/1979 | Mushkin | 181/199 X |
| 4,249,037 | 2/1981 | Dexter | 181/144 X |

*Primary Examiner*—Benjamin R. Fuller

[57] ABSTRACT

A singular configuration for a high fidelity sound speaker enclosure is disclosed. This acoustical structure is formed in two joined sections: the upper section which generally forms a four sided truncated pyramid and the lower section which generally forms an inverted four sided truncated pyramid. The complete structure, when viewed toward its frontal aspect, exhibits a generally hexagonal shape. The enclosure may house one or more speaker drivers and one of several methods of interior acoustic control may be utilized. The non-parallel walls and slanted front panel contribute to improved audio dynamics for electronic sound reproduction systems, and the overall design enhances contemporary decor aspects.

6 Claims, 3 Drawing Figures

ELECTRO-MECHANICAL REPRODUCTION OF SOUND

The enclosure system in which cone type speaker drivers are usually mounted effects control over complex acoustic forces that act on both sides of the vibrating cone. Such enclosures strongly affect the overall sound quality which is produced via electronic audio systems. Presented herewith is a unique enclosure design that brings forth a new level of improvement to the audio quality in electronically reproduced sound, especially in the bass region of audio response.

Previously, enclosures have tended to be rectangular in shape. But acoustic principles relating to wave diffraction effects engender certain advantages toward a better, cleaner and fuller fidelity audio response where an enclosure is designed with non-parallel interior surfaces and a slanted frontal face.

BRIEF DESCRIPTION OF THE DRAWINGS

These ideas are incorporated in the present invention and will become apparent to those skilled in the art from the following detailed description and accompanying drawings, in which.

Figure 1:
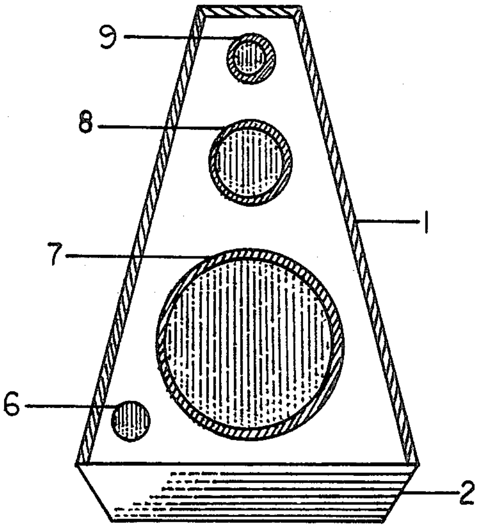
FIG. 1 is a front view of an enclosure of the invention.

In the drawings, a specific design (FIG. 1 and FIG. 2) of the generalized concept (FIG. 3) is illustrated. It is observed that, in general, the frontal view of the design is a hexagonal shape.

Figure 2:
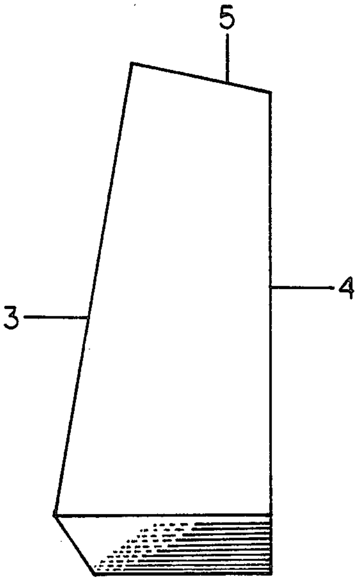
FIG. 2 is a side view of an enclosure of the invention.

In the specific design for an enclosure in FIGS. 1 and 2, the structure can be divided into two sections for reference: First, an upper section 1; and second, a lower section 2. Section 1, the upper enclosure, consists of several flat panels which form a four sided pyramid configuration, where at least one of these panels (indicated by 3 in the drawing) has several openings (such as 7, 8 and 9) to accomodate speaker drivers (electromagnetic audio transducers), tuned ducted bass reflex porting (such as 6), and may accomodate other hardware such as transducer output controls. Section 2, the lower enclosure, consists of several flat panels that form an inverted four sided truncated pyramid configuration which is bonded to the upper section at their mutual interfacial edges, and which acts also as a pedestal for the entire enclosure to rest upon.

Considering possible variations in the form of this design, first it is observed that the structure shown in FIGS. 1 and 2 has an upper section which is a non-regular four sided pyramid with an oblique truncation on top, and a lower section which is an inverted non-regular pyramid which is perpendicularly truncated at a short distance from its base. However, both sections 1 and 2 may also be four-sided pyramids with variations in the degree of regularity and of truncation to each.

Figure 3:
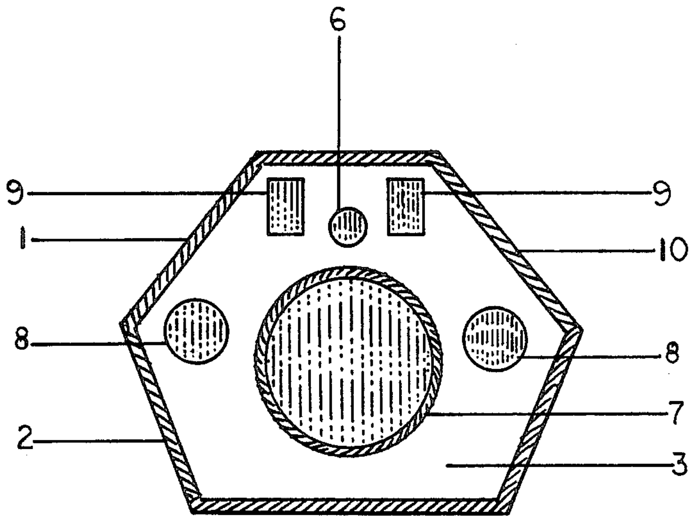
FIG. 3 is a front view of a generalized enclosure of the invention.

In FIG. 3 of the drawing, the generalized concept depicts an acoustical enclosure for audio drivers which, viewed face-on, obtains a generally hexagonal geometric shape. This same shape would be obtained if any vertical plane were made to intersect the structure anywhere in depth and perpendicular to the frontal line of sight.

In FIG. 3, enclosure system 10 has a lower section 2, an upper section 1, and a front panel 3 which accomodates various hardware via openings such as 7 (bass speaker), 8 (midrange speaker), 9 (tweeter) and 6 (bass reflex duct). The total innerspace of this enclosure (both sections 1 and 2) is fully functional in the sense of the audio dynamics which relate to bass reflex action. The enclosure walls, being non-parallel, serve to minimize the distortion effects of audio wave diffraction. The overall design effect, as tested, provides an excellent bass response characteristic. The slanted front panel (3) minimizes driver phase distortion effects at ear level.

The enclosure is constructed of good quality three-fourths inch thick plywood or particle board. All edges may be bonded with adhesive, screws and nails to provide an airtight structure with all components installed. These latter may be gasketed. The front and rear panels (3 and 4, respectively) should be set on continuous inset support strips which are fastened to the inner surfaces. Rear panel 4 contains a small inset panel for electrical connectors and fuses. If rear panel 4 is removable, gasketing is used to seal it in place.

In the enclosure design of FIGS. 1 and 2, it is noticed that panel 3 exhibits four circular openings. The purpose of these particular openings is as follows: No. 6—accomodates tuned ducting for bass reflex; No. 7—accomodates low audio range (bass) speaker driver; No. 8—accomodates mid-range speaker driver; No. 9—accomodates high range (tweeter) speaker driver. Of course, there may be variances in the number, shape and placement of these openings in the upper section. Additionally, other methods than bass reflex porting, such as sealed suspension or passive radiation, may be used to effect control of the acoustical dynamics within the enclosure.

Hardware such as a crossover network, L-pad (transducer output) controls and amplifier input connectors are installed securely against inner enclosure surfaces at appropriate locations to minimize wire lengths, and all feed-through openings are made airtight. Speaker drivers are flush-mounted in the front panel. The inside enclosure surfaces are acoustically damped with a one inch layer of acoustic insulation, along one long side and the bottom. The exterior surfaces may be finished as desired: a genuine wood veneer is preferred, while the grille and pedestal front panel are black. The grille, which is removable, is made from an acoustically transparent material over a frame. It covers the upper front panel.

Therefore, having described and shown these things, I hereby claim as my invention:

1. A high fidelity sound speaker enclosure, comprising;

an upper housing section consisting of a plurality of walls or panels substantially forming a four sided pyramid configuration, at least one of said panels having a plurality of transducer mounted therein, a bass reflex porting mounted in at least one of said panels;

a lower housing section consisting of a plurality of walls or panels substantially forming an inverted four sided truncated pyramid configuration, said lower housing section being connected to the upper housing section and forming a pedestal, therefore;

said upper housing section and lower housing section together exhibiting a generally hexagonal shape when viewed in a frontal position.

2. The high fidelity sound speaker enclosure of claim 1, wherein the upper housing section is a truncated pyramid.

3. The high fidelity sound speaker enclosure of claim 2, wherein the upper housing section forms a regular pyramid.

4. The high fidelity sound speaker enclosure of claim 2, wherein the upper housing section forms a non-regular pyramid.

5. The high fidelity sound speaker enclosure of claim 3 or 4, wherein the lower housing section forms a regular pyramid.

6. The high fidelity sound speaker enclosure of claim 3 or 4, wherein the lower housing section forms a non-regular pyramid.

* * * * *